United States Patent [19]

Vowles et al.

[11] Patent Number: 5,076,205

[45] Date of Patent: Dec. 31, 1991

[54] MODULAR VAPOR PROCESSOR SYSTEM

[75] Inventors: E. John Vowles, Deering, N.H.; Joseph A. Maher, Wenham, Mass.; Joseph D. Napoli, Windham, N.H.

[73] Assignee: General Signal Corporation, Stamford, Conn.

[21] Appl. No.: 294,278

[22] Filed: Jan. 6, 1989

[51] Int. Cl.⁵ .......................................... C23C 16/00
[52] U.S. Cl. ..................... 118/719; 118/715; 118/723; 156/345; 34/91; 204/298.25; 204/298.35; 414/217; 414/401; 414/416
[58] Field of Search ............... 118/715, 719, 723, 729; 156/345, 643, 646; 204/192.12, 192.32, 298.25, 298.35; 414/217, 222, 225, 401, 416; 34/18, 60, 91

[56] References Cited

U.S. PATENT DOCUMENTS

| | | | |
|---|---|---|---|
| 4,318,767 | 3/1982 | Hijikata et al. | 156/345 |
| 4,405,435 | 9/1983 | Tateishi et al. | 204/298 |
| 4,477,311 | 10/1984 | Mimura et al. | 156/643 |
| 4,498,416 | 2/1985 | Bouchaib | 414/217 |
| 4,534,314 | 8/1985 | Ackley | 118/733 |
| 4,542,712 | 9/1985 | Sato et al. | 414/217 |
| 4,547,247 | 10/1985 | Warenback et al. | 156/345 |
| 4,548,699 | 10/1985 | Hutchinson et al. | 204/298 |
| 4,550,239 | 10/1985 | Uehara et al. | 156/345 |
| 4,563,240 | 1/1986 | Shibata et al. | 156/643 |
| 4,584,045 | 4/1986 | Richards | 156/345 |
| 4,587,002 | 5/1986 | Bok | 204/298 |
| 4,592,306 | 6/1986 | Gallego | 118/719 |
| 4,622,918 | 11/1986 | Bok | 118/718 |
| 4,661,196 | 4/1987 | Hockersmith et al. | 156/345 |
| 4,661,228 | 4/1987 | Mintz | 204/192.25 |
| 4,664,062 | 5/1987 | Kamohara et al. | 118/719 |
| 4,668,338 | 5/1987 | Maydan et al. | 156/643 |
| 4,668,365 | 5/1987 | Foster et al. | 204/192.23 |
| 4,670,126 | 6/1987 | Messer et al. | 204/298 |
| 4,674,621 | 6/1987 | Takahashi | 198/378 |
| 4,705,951 | 11/1987 | Layman et al. | 250/442.1 |
| 4,713,551 | 12/1987 | Layman et al. | 250/561 |
| 4,715,764 | 12/1987 | Hutchinson | 414/217 |
| 4,715,921 | 12/1987 | Maher et al. | 156/345 |
| 4,717,461 | 1/1988 | Strahl et al. | 204/192.1 |
| 4,724,621 | 2/1988 | Hobson et al. | 34/218 |
| 4,756,815 | 7/1988 | Turner et al. | 204/298 |
| 4,763,602 | 8/1988 | Madan et al. | 414/217 |
| 4,770,590 | 9/1988 | Hugues et al. | 414/225 |
| 4,775,281 | 10/1988 | Prentakis | 414/217 |
| 4,825,808 | 5/1989 | Takahashi et al. | 156/345 |
| 4,851,101 | 7/1989 | Hutchinson | 204/192.12 |
| 4,852,516 | 8/1989 | Rubin et al. | 118/719 |

FOREIGN PATENT DOCUMENTS

| | | |
|---|---|---|
| 0165400 | 12/1985 | European Pat. Off. . |
| 0272141 | 6/1988 | European Pat. Off. . |
| 55-141570 | 11/1980 | Japan . |
| 60-238134 | 11/1985 | Japan ............... 156/345 |
| WO87/06561 | 11/1987 | PCT Int'l Appl. . |
| 2156451 | 10/1985 | United Kingdom . |
| 2171978 | 9/1986 | United Kingdom . |

OTHER PUBLICATIONS

IBM Technical Disclosure Bulletin, vol. 29, No. 1, Jun. 29, 1986, "Vacuum Compatible Wafer Handler".

DRYTEK Brochure entitled "Quad System", ©Drytek Inc. 1985.

"Low-Temperature Direct Nitridation of Silicon in Nitrogen Plasma Generated by Microwave Discharge", by M. M. Moslehi et al., 1985, American Institution of Physics, 921 Journal of Applied Physics.

"Dry Etching Systems", from Semiconductor International, Oct. 1985, pp. 47-60.

Primary Examiner—Shrive Beck
Assistant Examiner—Terry J. Owens
Attorney, Agent, or Firm—Weingarten, Schurgin, Gagnebin & Hayes

[57] ABSTRACT

A system for multichamber processing of semiconductor wafers providing flexibility in the nature of processing available in a multi processing facility. To accommodate changing processing demands and chamber replacement, a mobile processing chamber selectively docks with a multiple chamber system to form one of its processing chambers. The capabilities of the multiprocessing multichamber system are enhanced by extending the system to other multichamber systems through intermediate buffer storage wafer cassette and elevator systems. The extending multichamber system is further provided with intermediate access wafer storage elevator cassettes.

21 Claims, 4 Drawing Sheets

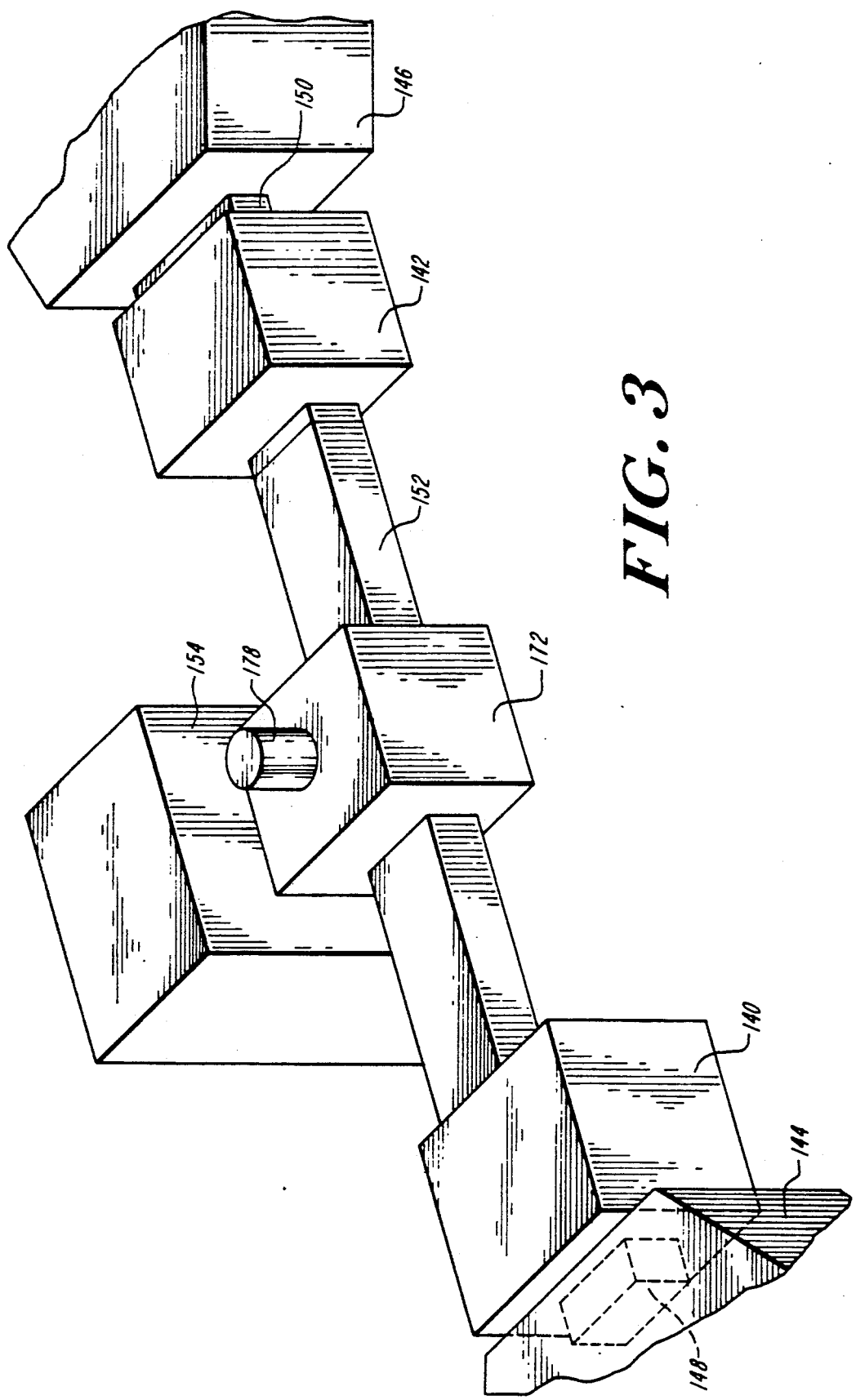

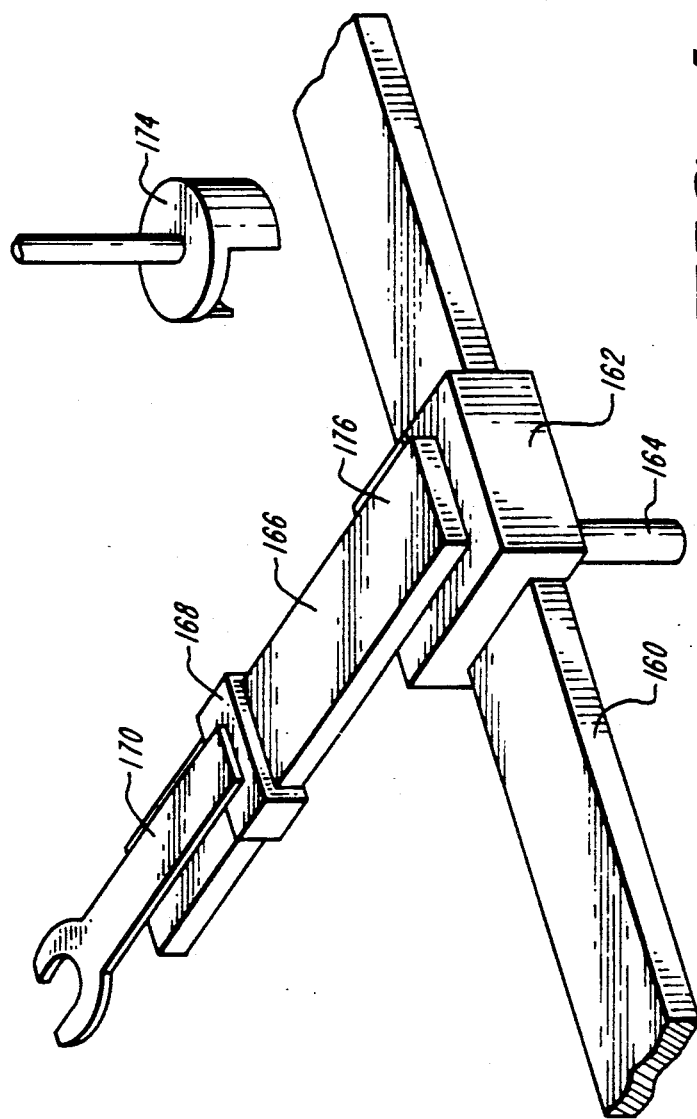

MODULAR VAPOR PROCESSOR SYSTEM

FIELD AND BACKGROUND OF THE INVENTION

The present invention relates to the processing of semiconductor wafers in plural chambers. As shown in our commonly assigned U.S. Pat. No. 4,715,921, issued Dec. 29, 1987 and U.S. Pat. Applications Ser. No. 853,775, Filed Apr. 18, 1986, and Ser. No. 115,774, Filed Oct. 30, 1987, the use of plural chambers to process semiconductor wafers permits more efficient, rapid and flexible semiconductor wafer plasma environment processing. In that disclosure the ability is provided to address the wafers in an individual cassette to different ones or multiples of processing chambers associated with that one cassette.

In the use of multiple chambers it can occur that one or more chambers must be serviced. Time is lost in the process of repairing or converting those chambers to other functions due to the extended period of time needed to bring chambers to the vacuum state needed to process semiconductor wafers.

BRIEF SUMMARY OF THE INVENTION

According to the teaching of the present invention a multi-processing, multichamber system is provided in which processing chambers associated with a multichamber multiprocessing facility are readily exchangeable to minimize "down time" and in which the use of buffer wafer storage elevator cassette systems is utilized to expand the number of processing chambers and provide wafer input and output access at intermediate points.

According to one embodiment of the invention, a cluster of processing chambers are arrayed about a wafer transport. One or more of the processing chambers is provided as a mobile system which may be selectively attached and detached to the wafer transport system without loss of the controlled environment within the transport and other chambers and without loss of the controlled environment within the mobile processing chamber itself. Each mobile chamber is equipped with its own evacuation capability along with the electronics for generating plasma, sputtering or other processing conditions within the processing chamber and with a gas feed system for supplying appropriate environmental gases to the chamber. The mobile character of the chamber permits the multi-chamber facility to continue to operate without complete breakdown in the case where it is desired to exchange one chamber for a chamber of a different processing type or to repair a chamber. Additionally, by providing back-up chambers in a pre-evacuated condition ready for selective attaching to a multichamber facility, the long down time necessary to pump down the system is avoided by keeping the remainder of the processing system at the environmentally controlled, typically low pressure environment, while the selectively attachable pre-evacuated chambers are attached and decoupled at the appropriate controlled environment. This necessitates the evacuation of only a small portion of unwanted gases which typically enter the system or mobile chamber through the docking mechanism that provides selective attachment of the mobile chamber to the multichamber multiprocessing facility.

In another embodiment of the invention the flexibility of multichamber multiprocessing facility is enhanced by coupling plural such facilities through intermediate wafer buffer storage cassette and elevator systems. Additionally, a wafer transport path, contained within a closed environment, is provided between elevators with an access elevator system along the transport path to permit intermediate wafer input and output.

BRIEF DESCRIPTION OF THE DRAWING

These and other features of the present invention are more fully described below in the solely exemplary detailed description and accompanying drawing of which:

FIG. 3 is an illustration of a wafer transport system for transporting wafers between buffer storage cassette elevator systems and providing access along the transport path for wafer insertion and removal; and FIG. 4 is a view of the transport mechanism within a controlled environment enclosure of FIG. 3.

DETAILED DESCRIPTION OF THE INVENTION

The present invention contemplates a system for providing multichamber multiprocessing of semiconductor wafers in which individual processing chambers are mobile to permit easy exchange of processing chambers without requiring the down time for complete system evacuation and further for permitting flexible extension of processing capabilities by joining multiprocessing multichamber facilities through a wafer buffer storage cassette and elevator system that may include intermediate buffer storage that permits wafer insertion and removal from the overall processing system.

Figure 1:
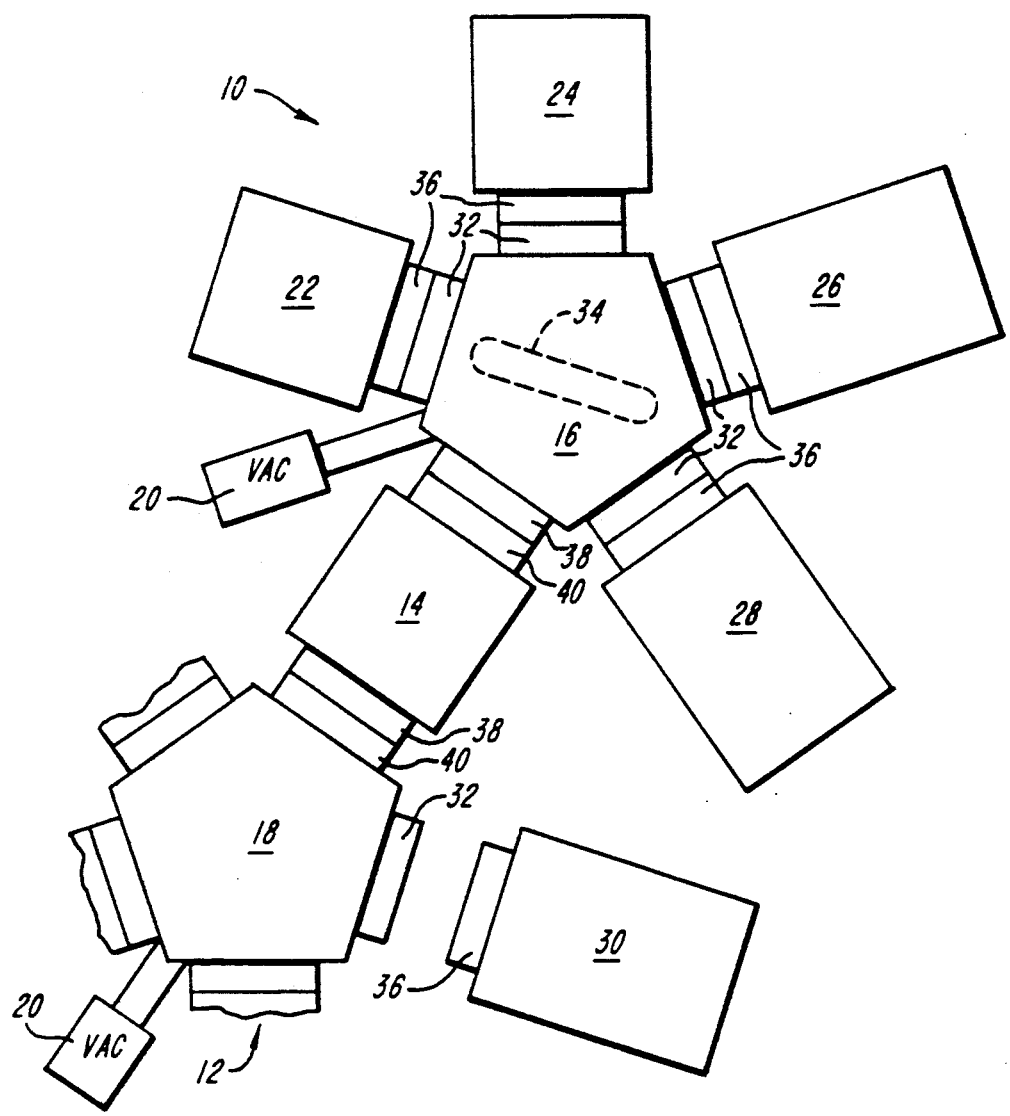
FIG. 1 is an overhead view of a multichamber multiprocessing system having plural multichamber facilities and mobile processing chambers with a wafer buffer storage cassette and elevator system between multichamber facilities.

Such a system is illustrated in FIG. 1 in which a multichamber multiprocessing facility 10 is connected to a second such multichamber multiprocessing facility 12 through an intermediate cassette system 14 which typically comprises a multi wafer containing cassette and elevator for positioning each wafer slot in the cassette at a point where it can be accessed by a transfer arm contained within respective transfer mechanisms 16 and 18 of the multiprocessing facilities 10 and 12. Each transport mechanism 16 and 18 is typically provided with a vacuum pump 20 capable of evacuating at least the interior of the transport mechanism 16 and 18.

Arrayed about each transport mechanism 16, 18 are a plurality of multiprocessing chambers. Those arrayed about the transfer mechanism 16 are illustrative of a typical single multiprocessing facility. As shown there processing modules 22 and 24 are of a type which may be permanently associated with the transfer mechanism 16 while processing modules 26 and 28 are mobile processing modules, more fully illustrated below in FIG. 2.

Figure 2:
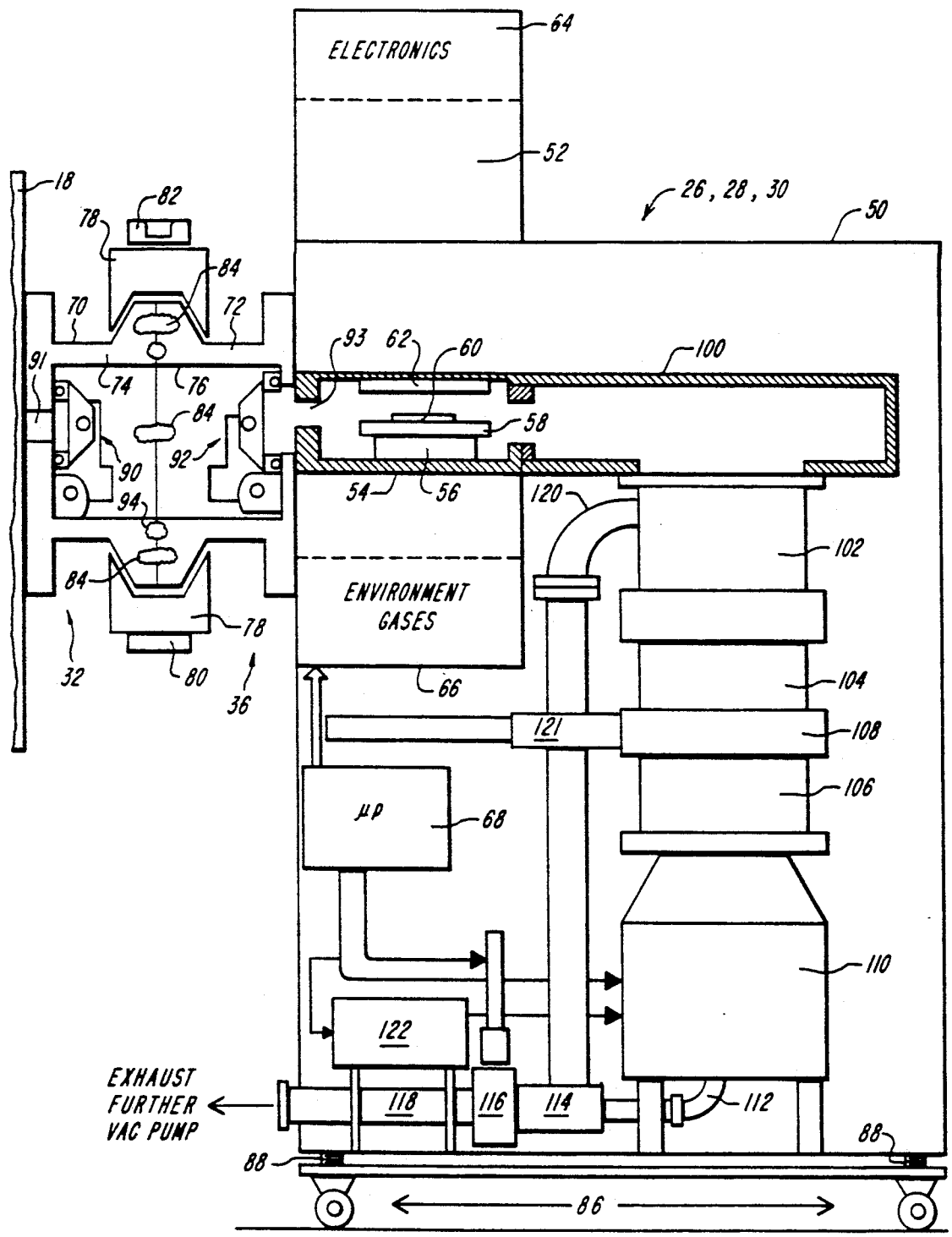
FIG. 2 is an elevational partially interior partially sectional view of a docked mobile chamber for use in the embodiment of FIG. 1.

Each of the chambers 22, 24, 26 or 28 are coupled to the transport mechanism 16 through a valved access port and docking mechanism comprising first parts 32 containing a slit access valve, as more fully illustrated in FIG. 2, through which a semiconductor wafer may be passed from the transport mechanism 16 on an arm 34 into and out of the respective chambers 22, 24, 26, 28 (or mobile chamber 30 for mechanism 18) through a further valve and docking mechanism 36 associated with each of the chambers 22, 24, 26 and 28 (and/or 30 for mechanism 18). The cassette elevator 14 is similarly coupled through a valve and docking mechanism 38 of the same type associated with the transport mechanism 16 and spacer collars 40 associated with the cassette elevator 14. Because the cassette elevator 14 does not contain a gaseous wafer processing environment it is normally unnecessary that the spacer 40 have a valve associated with it, but a spacer 40 is provided so that the distance between wafers in the cassette 14 and the pivot point of arm 34 can be made the same as the distance between that pivot point and the point at which wafers are placed within each of the processing chambers 22, 24, 26, 28, and 30.

Reference is additionally made to U.S. Pat. No. 4,715,921, issued Dec. 29, 1987 and U.S. Pat. Applications Ser. No. 853,775, Filed Apr. 18, 1986 and Ser. No. 115,774, Filed Oct. 30, 1987 in which portions of the structure of the FIG. 1 apparatus are additionally illustrated. The details of mobile processing chambers 26, 28 and 30 are illustrated more fully below with respect to FIG. 2.

As shown in FIG. 2 each of the chambers 26, 28 and 30 includes a housing 50 in which a module 52 is installed and that contains a chamber 54, having a pedestal 56 supporting a cathode 58 on which a wafer 60 is typically placed below an anode 62 from which, in the example of plasma processing, an electric field emanates to produce a plasma discharge for processing of the wafer 60. The module 52 additionally includes electronics 64 which in the case of plasma discharge provides the appropriate field between the anode 62 and cathode 58 as known in the art. The module 52 may also contains an environmental gas control system 66 to supply appropriate etching gases in the case of plasma etching or gases for other purposes as described below. The control of the electronics and environmental gas supplies 64 and 66 is under the direction of a microprocessor 68 located within the housing 50.

The module 52, in the specific illustration of FIG. 2, is intended for plasma etching of the surface of the wafer 60. Other modules can be provided that will employ other processing technologies such as chemical vapor deposition, sputtering, rapid thermal processing, rapid thermal annealing, plasma cleaning to name a few, and utilizing technology and apparatus already known in the art.

The module 52, as installed within the housing 50, mates, for wafer exchange and transfer, with the wafer transfer mechanism 18 through coupling and docking valves 32 and 36. In particular each such valve includes a conduit 70 and 72 which are fastened to the mechanism 18 and module 52 respectively. The conduits 70 and 72 have outer beveled flanges 74 and 76 respectively which are joined through a quick connect band 78 typically hinged at a hinge 80 and coupled with a clamp 82. Locating pins 84 are typically provided to accurately align the conduits 70 and 72 and thus module 52 with respect to the transfer mechanism 18 so that a wafer may be inserted through the conduit 70 and 72 into the chamber 54 and onto the cathode 58.

To facilitate this alignment, the housing 50 rolls upon a dolley system 86 which is adjustably supported from the base of the housing 50 through adjustment screws 88. Conduits 70 and 72 are typically elongated in the dimension in and out of the page in order to accommodate the full width of a semiconductor wafer.

In order to seal the controlled environment within the transfer mechanism 18 and within the chamber 54, valve assemblies 90 and 92 are provided within the conduits 70 and 72 respectively to seal access ports 91 and 93 into the respective interiors. Valves of this type are illustrated in the above-identified, commonly assigned patent and applications.

Seals 94 may be additionally provided in the facing surfaces of the conduits 70 and 72.

The interior of the chamber 54 is connected through a manifold 100 through a series of conduits 102, 104, 106 and computer controlled valve 108 to a turbo pump 110 which is in turn conducted through an output conduit 112 to an exhaust manifold 114, computer controlled exhaust valve 116 into an exhaust pipe 118 which exits through the housing 50 for attachment to a further exhaust and vacuum pump and to processing equipment for exhaust gases.

A conduit 120 feeds directly off the conduit 102 into the manifold 114 and then through the controlled valve 116 to the outlet 118.

In operation the computer 68 controls the turbo pump 110 and its power supply 122 in conjunction with the valves 108 and 116 and additional vacuum pump systems external of the housing 50 to provide rough and final exhausting of the chamber 54. Vacuum pump 20 evacuates the conduits 70 and 72 after docking.

FIG. 3 illustrates a further embodiment of the invention wherein a pair of cassette elevators 140 and 142 are coupled to a respective pair of transfer mechanisms 144 and 146 through associated valve interfaces 148 and 150, corresponding to the mechanisms 32 and 36 shown above. Wafers are transferred through a conduit 152 between the elevator systems 140 and 142. Intermediate along the transfer conduit 152 is an elevator cassette 154 providing access to the conduit 150 for the insertion and removal of wafers to be processed or after processing.

The actual transfer mechanism within the conduit 152 is illustrated in greater detail in FIG. 4. As shown there a linear guide 160 has a slide 162 driven along it by a drive mechanism 164. On top of slide 162 is an arm 166 and a further slide 168 running thereon, under positional control of the drive mechanism 164. The slide 168 contains a wafer arm 170 which can be extended into the cassette of elevators 140, 142 and 154 for the retrieval or insertion of a semiconductor wafer. The arm 166 is positioned either parallel to the guide 160, facing in either direction, or perpendicularly disposed into the elevator cassette 154 when in a central housing 172 positioned along the conduit 152. The position of the guide arm 166 is controlled by a rotatable hand 174 which can be elevated and dropped to engage the arm 166 at a central point 176 under the control of a drive and elevation mechanism 178 (FIG. 3) either automatically under computer control or by manual manipulation.

In this manner cassettes can be applied to the multichamber multiprocessing system associated with either of the transfer mechanisms 144 and 146 by loading into the corresponding cassette elevator systems 140 and 142 through the conduit 152 from the elevator 154. In this manner wafers can be exchanged between the elevators 140, 142 and 154 in any desired sequence to accomplish a broad range of wafer processing activities within the respective multiprocessing systems associated with each transfer mechanism 144 and 146. A plurality of additional intermediate elevator cassettes of the type of 154 may be applied along the conduit path or the path of conduit 152 in order to include as many multiprocessing facilities as is desired.

The teaching of the present invention through the specific embodiments addressed above is not to be seen as limited by the embodiments described above which exemplify it. The present invention is intended to be limited only in accordance with the following claims.

We claim:

1. A portable semiconductor processing chamber assembly matable with a stationary housing of a multi-processing semiconductor processing station having a semiconductor wafer transfer mechanism, comprising:
   a mobile housing including means for permitting movement of said housing over a surface;
   a chamber supported by said housing for controlled environment processing of a semiconductor wafer;
   means for establishing a controlled environment within said chamber to provide selected semiconductor processing;
   means for releasably docking said mobile housing with said stationary housing having said semiconductor wafer transfer mechanism in such a way that said chamber communicates with the semiconductor wafer transfer mechanism to permit transfer of a semiconductor wafer between said stationary housing of said multi-processing semiconductor processing station and said chamber along a wafer transport path; and
   means for providing a controlled environment along said wafer transport path.

2. The assembly of claim 1 wherein said housing includes means for adjusting the height and attitude of said housing to permit accurate docking.

3. The assembly of claim 1 wherein said means for establishing a controlled environment within said chamber includes means supported by said housing to provide gas evacuation of said chamber.

4. The assembly of claim 3 wherein said gas evacuation providing means includes means for coupling to a further evacuation means.

5. The assembly of claim 3 wherein said evacuation means includes a microprocessor controller.

6. The assembly of claim 3 further including valve means for maintaining the environment of said chamber.

7. The assembly of claim 1 further including a subhousing containing said chamber.

8. The assembly of claim 7 wherein said subhousing includes means for generating one of a plasma, chemical vapor deposition, rapid thermal processing, rapid thermal anneal, and a sputtering environment within said chamber.

9. The assembly of claim 1 wherein said docking means includes a conduit and means for mating said conduit with a complimentary conduit on said stationary housing having said transfer mechanism.

10. The assembly of claim 9 wherein said docking means further includes a valve between said chamber and said conduit.

11. The assembly of claim 10 further including, between said stationary housing and said complementary conduit, a valve mounted on said stationary housing.

12. The assembly of claim 9 further including means for providing quick connect/disconnect between said conduit and complimentary conduit.

13. A semiconductor wafer multiprocessing system comprising:
   a stationary housing defining a transfer station and having a robot transfer arm;
   means for storing semiconductor wafers;
   a plurality of semiconductor processing chambers arranged about said transfer station to permit transfer of semiconductor wafers between said storing means and said processing chamber;
   at least one of said processing chambers including;
   a mobile housing including means for permitting movement of said housing over a surface;
   a chamber supported by said housing for controlled environment processing of a semiconductor wafer;
   means for establishing a controlled environment within said chamber to provide selected semiconductor processing;
   means for releasably docking said mobile housing with said stationary housing of said transfer station having said robot transfer arm in such a way that the chamber thereof communicates with the robot transfer arm to permit transfer of a semiconductor wafer between said stationary housing of said transfer station and said chamber along a wafer transport path; and
   means for providing a controlled environment along said wafer transport path.

14. A semiconductor wafer multiprocessing system comprising:
   means for storing semiconductor wafers;
   a first transfer station having a stationary housing;
   a first plurality of semiconductor processing chambers arrayed with said first transfer station and said storing means to permit transfer of semiconductor wafers between said storing means and said first plurality of processing chambers;
   a second transfer station having a stationary housing;
   a second plurality of semiconductor processing chambers arrayed with said second transfer station and said storing means to permit transfer of semiconductor wafers between said storing means and said second plurality of processing chambers;
   conduit means for providing a controlled wafer transfer environment between said stationary housings of said first and second transfer stations;
   said storing means being located along a generally straight line defined between said first and second transfer stations and positioned within said conduit means; and wherein
   one of said first and second pluralities of processing chambers further includes a mobile housing including means for permitting movement of said mobile housing over a surface, a chamber supported by said mobile housing for controlled environment processing of a semiconductor wafer, means for establishing a controlled environment within said mobile housing to provide selected semiconductor processing, means for releasably docking said mobile housing with the stationary housing of one of said first and second transfer stations in such a way that the chamber thereof communicates with the transfer station to permit transfer of a semiconductor wafer between said stationary housing of said one of said first and second transfer stations and said chamber along a wafer transport path, and means for providing a controllable environment along said wafer transport path.

15. A semiconductor wafer multiprocessing system comprising:
   a conduit;

first, second and third means for storing semiconductor wafers positioned along said conduit in spaced-apart relation;

a first transfer station;

a transfer mechanism disposed in said conduit for transferring semiconductor wafers between said first, said second and said third storing means;

a first plurality of semiconductor processing chambers arranged with said first transfer station;

said transfer mechanism cooperating with said first transfer station to permit transfer of semiconductor wafers between said first transfer station and any one of said first plurality of processing chambers;

a second transfer station;

a second plurality of semiconductor processing chambers arrayed with said second transfer station;

said transfer mechanism cooperating with said second transfer station to permit transfer of semiconductor wafers between said second transfer station and any one of said second plurality of processing chambers;

said conduit extending between said first and said second transfer stations.

16. The system of claim 15 wherein said first and said second storing means are spaced apart along a line, and said third storing means is intermediate the first and second storing means, and wherein said transfer mechanism includes:

an arm;

a track;

means for guiding said arm along said track between said first and second storing means past said intermediate third storing means; and means for extending said arm from said track into said first, second and third storing means.

17. The system of claim 16 further including means for changing a direction of said arm between pointing along said track toward said first or second storing means and away from said track toward said third storing means.

18. The system of claim 16 further including means for providing said transfer mechanism with a controlled environment.

19. A system for transferring semiconductor wafers between first and second spaced-apart multi-processing wafer processing systems, comprising:

a track having an extension selected to extend between the first and second spaced-apart multi-processing wafer processing systems;

an arm mounted to said track for reciprocating motion therealong;

means for guiding said arm along said track between a first and second storing means past a third storing means; and means for extending said arm from said track into said first, second and third storing means.

20. The system of claim 19 further including means for changing a direction of said arm between pointing along said track toward said first or second storing means and away from said track toward said third storing means.

21. The system of claim 19 further including means for containing said arm and said track within a controlled environment.

* * * * *

UNITED STATES PATENT AND TRADEMARK OFFICE
CERTIFICATE OF CORRECTION

PATENT NO. : 5,076,205

DATED : December 31, 1991

INVENTOR(S) : E. John Vowles, Joseph A. Maher and Joseph D. Napoli

It is certified that error appears in the above-identified patent and that said Letters Patent is hereby corrected as shown below:

Column 5, line 11, in claim 1 "semiconductor" should read --substrate--.

Column 5, line 14, in claim 1 "semiconductor wafer" should read --substrate--.

Column 5, line 18, in claim 1 "semiconductor wafer" should read --substrate--.

Column 5, lines 20-21, in claim 1 "semiconductor" should read --substrate--.

Column 5, lines 23-24, in claim 1 "semiconductor wafer" should read --substrate--.

Column 5, lines 25-26, in claim 1 "semiconductor wafer" should read --substrate--.

Column 5, line 27, in claim 1 "semiconductor wafer" should read --substrate--.

Column 5, line 28, in claim 1 "semiconductor" should read --substrate--.

Column 5, line 29, in claim 1 "wafer" should read --substrate--.

Column 5, line 32, in claim 1 "wafer" should read --substrate--.

UNITED STATES PATENT AND TRADEMARK OFFICE
CERTIFICATE OF CORRECTION

PATENT NO. : 5,076,205

DATED : December 31, 1991

INVENTOR(S) : E. John Vowles, Joseph A. Maher and Joseph D. Napoli

It is certified that error appears in the above-identified patent and that said Letters Patent is hereby corrected as shown below:

Column 5, line 67, in claim 13 "semiconductor wafer" should read --substrate--.

Column 6, line 3, in claim 13 "semiconductor wafers" should read --substrates--.

Column 6, line 4, in claim 13 "semiconductor" should read --substrate--.

Column 6, line 5, in claim 13 "arranged" should read --arrayed--.

Column 6, line 6, in claim 13 "semiconductor wafers" should read --substrates--.

Column 6, line 7, in claim 13 "chamber" should read --chambers--.

Column 6, line 12, in claim 13 "semiconductor wafer" should read --substrate--.

Column 6, line 14-15, in claim 13 "semiconductor" should read --substrate--.

Column 6, line 20-21, in claim 13 "semiconductor wafer" should read --substrate--.

UNITED STATES PATENT AND TRADEMARK OFFICE
CERTIFICATE OF CORRECTION

PATENT NO. : 5,076,205
DATED : December 31, 1991
INVENTOR(S) : E. John Vowles, Joseph A. Maher and Joseph D. Napoli It is certified that error appears in the above-identified patent and that said Letters Patent is hereby corrected as shown below:

Column 6, line 22, in claim 13 "wafer" should read --substrate--.

Column 6, line 25, in claim 13 "wafer" should read --substrate--.

Column 6, line 26, in claim 14 "semiconductor wafer" should read --substrate--.

Column 6, line 28, in claim 14 "semiconductor wafers" should read --substrates--.

Column 6, line 30, in claim 14 "semiconductor" should read --substrate--.

Column 6, line 33, in claim 14 "semiconductor wafers" should read --substrates--.

Column 6, line 36, in claim 14 "semiconductor" should read --substrate--.

Column 6, line 38-39, in claim 14 "semiconductor wafers" should read --substrates--.

Column 6, line 41, in claim 14 "wafer" should read --substrate--.

UNITED STATES PATENT AND TRADEMARK OFFICE
CERTIFICATE OF CORRECTION

PATENT NO. : 5,076,205
DATED : December 31, 1991
INVENTOR(S) : E. John Vowles, Joseph A. Maher and Joseph D. Napoli It is certified that error appears in the above-identified patent and that said Letters Patent is hereby corrected as shown below:

Column 6, line 47-48, in claim 14 "means; and wherein ¶one of said" should read --means; and wherein one of said--.

Column 6, line 60, in claim 14 "semiconductor wafer" should read --substrate--.

Column 6, line 63, in claim "wafer" should read --substrate--.

Column 6, line 65, in claim 14 "wafer" should read --substrate--.

Column 6, line 66, in claim 15 "semiconductor wafer" should read --substrate--.

Column 7, line 2-3, in claim 15 "semiconductor wafers" should read --substrates--.

Column 7, line 7, in claim 15 "semiconductor wafers" should read --substrates--.

Column 7, line 9, in claim 15 "semiconductor" should read --substrate--.

UNITED STATES PATENT AND TRADEMARK OFFICE
CERTIFICATE OF CORRECTION

PATENT NO. : 5,076,205
DATED : December 31, 1991
INVENTOR(S) : E. John Vowles, Joseph A. Maher and Joseph D. Napoli It is certified that error appears in the above-identified patent and that said Letters Patent is hereby corrected as shown below:

Column 7, line 10, in claim 15 "arranged" should read --arrayed--.

Column 7, line 13-14, in claim 15 "semiconductor wafers" should read --substrates--.

Column 7, line 17, in claim 15 "semiconductor" should read --substrate--.

Column 7, line 21-22, in claim 15 "semiconductor wafers" should read --substrates--.

Column 8, line 14, in claim 19 "semiconductor wafers" should read --substrates--.

Column 8, line 16, in claim 19 "wafer" should read --substrate--.

Column 8, line 19, in claim 19 "wafer" should read --substrate--.

Signed and Sealed this

Twenty-first Day of December, 1993

Attest:

BRUCE LEHMAN

*Attesting Officer*    Commissioner of Patents and Trademarks